United States Patent [19]
Tomesen et al.

[11] Patent Number: 5,757,531
[45] Date of Patent: May 26, 1998

[54] GILS FOR HETERODYNE RECEIVER HAVING LOW INTERMEDIATE FREQUENCY

[75] Inventors: Markus T. Tomesen, Venld; Geert F. G. Depovere; Rene A. J. C. M. Van Gils, both of Eindhoven, all of Netherlands

[73] Assignee: U.S. Philips Corporation, New York, N.Y.

[21] Appl. No.: 798,807

[22] Filed: Feb. 12, 1997

Related U.S. Application Data

[63] Continuation of Ser. No. 420,263, Apr. 11, 1995.

[30] Foreign Application Priority Data

Dec. 4, 1994 [EP] European Pat. Off. .............. 94200985

[51] Int. Cl.⁶ .................................................. H04B 10/06
[52] U.S. Cl. ............................................................. 359/191
[58] Field of Search .................................. 359/189–191, 359/173, 195; 455/141; 375/324; 329/302, 306, 323, 346, 358

[56] References Cited

U.S. PATENT DOCUMENTS

| | | | |
|---|---|---|---|
| 5,081,712 | 1/1992 | Meissner | 359/191 |
| 5,115,332 | 5/1992 | Naito | 359/189 |
| 5,134,634 | 7/1992 | Yoshida | 375/324 |
| 5,138,476 | 8/1992 | Shibutani | 359/191 |
| 5,140,277 | 8/1992 | Hooijmans et al. | 329/302 |
| 5,146,359 | 9/1992 | Okoshi et al. | 359/191 |
| 5,259,033 | 11/1993 | Goodings et al. | 381/68 |

FOREIGN PATENT DOCUMENTS

| | | |
|---|---|---|
| 0280075 | 8/1988 | European Pat. Off. . |
| 0319788 | 6/1989 | European Pat. Off. . |

*Primary Examiner*—Kinfe-Michael Negash
*Attorney, Agent, or Firm*—Leroy Eason

[57] ABSTRACT

An optical heterodyne receiver converts a received modulated optical signal into an electrical IF signal by an IF converter which includes a local laser, a coupling element and an opto-electrical converter. The IF signal is converted into a demodulated signal by a demodulator having a quadratic transfer characteristic. To permit a relatively low intermediate frequency, the IF converter converts the received signal into two quadrature IF signals and in the demodulator two sub-demodulators recover therefrom two demodulated signals which are then combined. This eliminates unwanted quadratic components in the combined signal.

3 Claims, 4 Drawing Sheets

GILS FOR HETERODYNE RECEIVER HAVING LOW INTERMEDIATE FREQUENCY

This is a continuation of application Ser. No. 08/420,263, filed Apr. 11, 1995.

BACKGROUND OF THE INVENTION

1. Field of the Invention

The invention relates to a transmission system comprising a transmitter for deriving a modulated signal from an input signal, a channel for conveying the modulated signal to a receiver, the receiver comprising converter means for converting the modulated signal into an intermediate frequency signal, the receiver also comprising demodulation means which have a quadratic amplitude transfer characteristic for deriving a replica of the input signal from the intermediate frequency signal.

The invention likewise relates to a receiver for use in such a transmission system.

2. Description of the Related Art

A transmission system as defined in the opening paragraph is known from U.S. Pat. No. 5,140,277.

For conveying an input signal via a channel it is often necessary to derive from this input signal a high-frequency modulated signal that is suitable for being conveyed via the channel. Examples of such channels are radio channels, glass fibres or coaxial cables. At the receiver end the modulated signal is converted by converter means into an intermediate frequency signal whose frequency is lower than that of the modulated signal. The converter means may comprise, for example, a local oscillator and a mixer stage. The frequency of the intermediate frequency signal is then equal to the difference between the frequency of the modulated signal and that of the signal generated by the local oscillator. The intermediate frequency signal thus obtained is converted into a replica of the input signal by the demodulation means.

The demodulation means according to said Patent have a quadratic amplitude transfer characteristic, meaning that the relationship between the amplitude of the input signal and the amplitude of their output signal has a quadratic component. As a result, the demodulated signal contains a (low frequency) replica of the input signal, and a component having a central frequency equal to twice the intermediate frequency. This unwanted component may often be removed by a low-pass filter.

If the input signal of the receiver has a wide bandwidth, the frequency spectrum of the replica of the input signal and the frequency spectrum of the unwanted component may happen to overlap. In that situation it is impossible to remove the unwanted component by a filter. In order to avoid this overlapping, the intermediate frequency of the receiver is to be selected sufficiently high. The disadvantage of a high intermediate frequency is that this requires components that have good high frequency properties.

SUMMARY OF THE INVENTION

It is an object of the invention to provide a transmission system as set out in the opening paragraph for which the intermediate frequency can be reduced considerably.

For this purpose, the invention is characterized in that the intermediate frequency signal comprises a first quadrature signal and a second quadrature signal, and in that the demodulation means comprise a first sub-demodulator for deriving a first demodulated signal from the first quadrature signal and a second sub-demodulator for deriving a second demodulated signal from the second quadrature signal, while the first sub-demodulator and the second sub-demodulator have a quadratic amplitude transfer characteristic, and combining means for deriving the replica of the input signal via a combination of the first and second demodulated signals.

The quadratic transfer of the demodulators provides two positive signals at the outputs of the two sub-demodulators, which positive signals each represent the input signal of the transmitter. Since the modulated signals have a 90° phase difference, the unwanted quadratic components at the outputs of the two sub-demodulators have a 180° phase difference. A replica of the input signal of the transmitter is determined by the combining means, during which operation the two unwanted components in the output signals of the two sub-demodulators cancel each other. The two positive signals representing the input signal of the transmitter, however, will be added together and will thus be present at the output of the demodulation means.

An embodiment of the invention is characterized in that the modulated signal comprises an optical signal, in that the converter means comprise an opto-electrical converter for converting the modulated signal into a modulated electric signal, and quadrature signal generating means for converting the modulated electric signal into the first quadrature signal and the second quadrature signal.

In optical transmission systems in which a heterodyne receiver is used it appears to be rather complicated to generate two optical quadrature signals. By converting the optical signal into an electric intermediate frequency signal, and generating two quadrature signals from this electric intermediate frequency signal, no optical quadrature signals needs to be generated. Generating electric quadrature signals is rather simple. This may be effected, for example, by a 90°0 hybrid coupler or by mixing the electric intermediate frequency signal with two signals generated by a local oscillator and mutually shifted through 90°.

An additional advantage of this embodiment, in which embodiment electrical quadrature signal generating means are used, is that any equalizer used for compensating for the dispersion of the glass fibre needs to be provided only singly now. This equalizer is then to be inserted between the opto-electrical converter and the quadrature signal generating means. The use of optical quadrature signals, which are converted into corresponding electric quadrature signals, would require two identical equalizers.

BRIEF DESCRIPTION OF THE DRAWINGS

The invention will be further explained with reference to the drawing Figures in which like reference characters denote like elements, in which.

DESCRIPTION OF THE PREFERRED EMBODIMENTS

Figure 1:
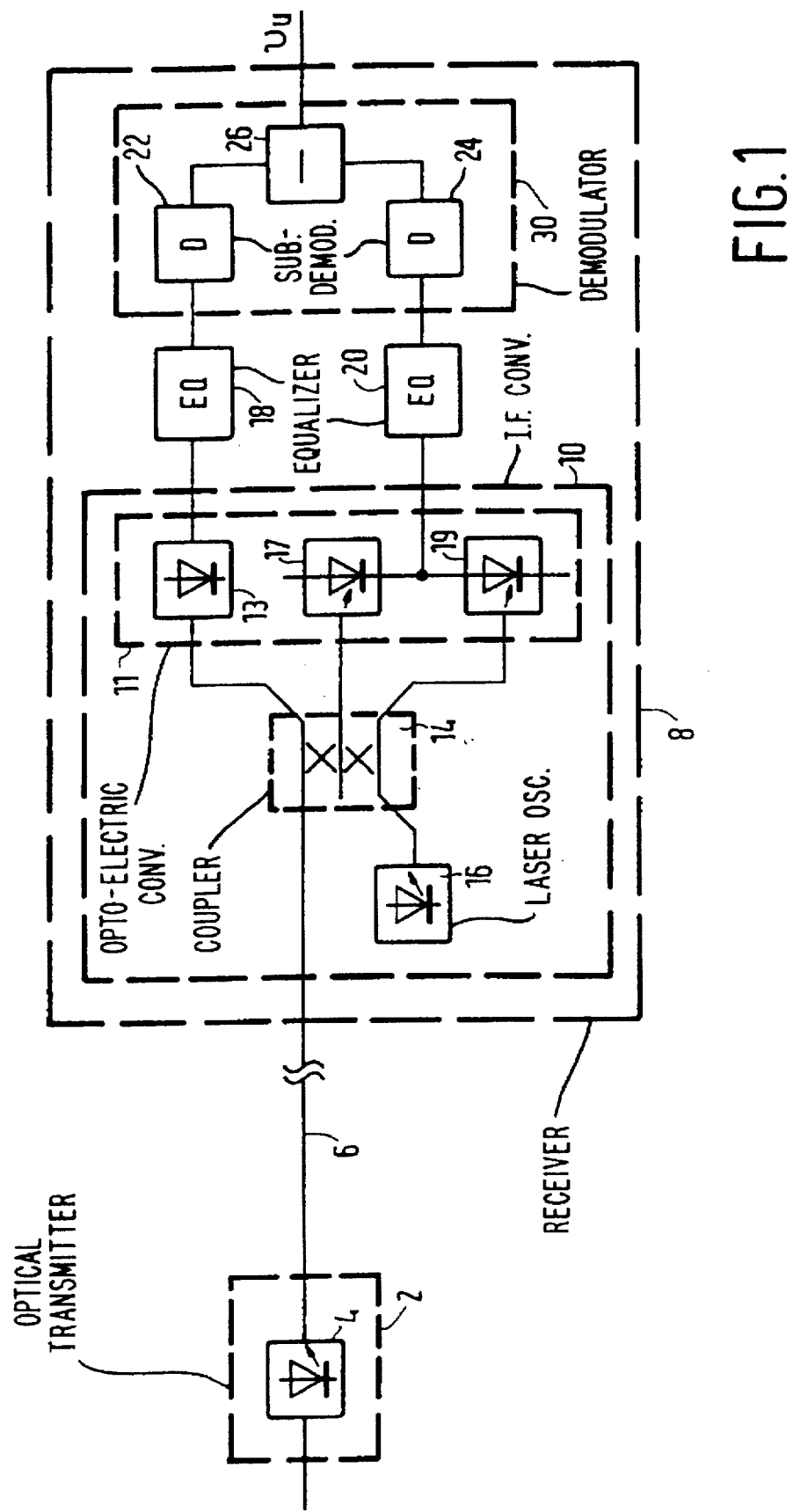
FIG. 1 shows a first embodiment for a transmission system according to the invention.

In the transmission system shown in FIG. 1 an input signal is applied to an input of a transmitter 2. This input signal is converted into a modulated signal by a modulator, in this case formed by an electro-optical converter 4. The output of the transmitter 2, carrying the modulated signal for its output signal, is connected to an input of the channel, in this case formed by a glass fibre 6.

The output of the glass fibre 6 is connected to an input of a receiver 8. This input is connected inside the receiver 8 to an input of the converter means 10. These converter means likewise form the quadrature signal generating means here. The input of the converter means 10 is connected to a first input of a coupling element 14. An output of a local oscillator, which oscillator is here a laser 16, is connected to a second input of the coupling element 14. First, second and third outputs of the coupling element 14 are connected to inputs of an opto-electrical converter 11. The first output of the coupling element 14 is connected to an input of a photodiode 13, the second output of the coupling element 14 is connected to a photodiode 17 and the third output of the coupling element is connected to a photodiode 19.

The output of the photodiode 13, carrying the first quadrature signal for its output signal, is connected to an input of an equalizer 18. The outputs of the photodiodes 17 and 19 are interconnected, so that their output signals can be subtracted from each other. The combined output signal of the photodiodes 17 and 19 forms the second quadrature signal. This second quadrature signal is applied to an equalizer 20. The output of the equalizer 18 is connected to a first input of the demodulation means 30, while the output of the equalizer 20 is connected to a second input of the demodulation means 30.

The first input of the demodulation means 30 is connected to an input of the sub-demodulator 22, while the second input of the demodulation means 30 is connected to an input of the second sub-demodulator 24. The output of the first sub-demodulator 22 is connected to a first input of the combining means 26. The output of the second sub-demodulator 24 is connected to a second input of the combining means 26. The output of the combining means 26 also forms the output of the receiver 8.

The opto-electrical converter 4 derives the modulated signal from the input signal by modulation on an optical carrier. This optical carrier may be amplitude, frequency or phase modulated. The modulated signal is conveyed to the receiver 8 through the glass fibre 8.

In the receiver 8, an optical local oscillator signal generated by the laser 16 is combined with the received modulated signal in the coupling element 14. Three optical signals which are each proportional to the sum of the optical local oscillator signal and the modulated signal are available on the three outputs of the coupling element 14. These three optical signals additionally show a 120° phase difference.

By applying these three optical signals to corresponding photodiodes 13, 17 and 19, and by adding the output signals of the photodiodes 17 and 19 together, the (electric) first and second quadrature signals are obtained having an amplitude ratio of $1:\sqrt{3}$ and a 90° phase difference. These signals are applied to the demodulation means 30 via the equalizers 18 and 20.

The equalizers are intended to compensate for the dispersion of the glass fibre. When an optical signal is transmitted through a glass fibre, the group delay time appears to decrease slightly as a function of frequency when the frequency increases. For digital transmission, especially at high transmission rates, this may lead to intersymbol interference, so that separate symbols start to overlap, which complicates detection in the receiver.

By inserting an equalizer, whose group delay time increases as a function of frequency, between the opto-electrical converters and the demodulation means 30, the decreasing group delay time of the glass fibre can be compensated for. There should then be provided that the local oscillator frequency is lower than the frequency of the modulated signal, so that no spectrum inversion occurs. Such an equalizer may be readily realised by a microstrip line whose cut-off frequency of the $TE_{10}$ mode lies slightly above the frequency of the intermediate frequency signal. The length of the strip line is selected in dependence on the length of the glass fibre 6 to obtain optimum dispersion compensation.

It is noted that it is alternatively possible, in principle, for the receiver to comprise, in addition to equalizing means, compensation means for compensation for non-linear effects in the transmission channel.

The sub-demodulators 22 and 24 now provide the demodulation of the two equalized quadrature signals, while the combining means 26 derives the replica of the input signal from the output signals of the sub-demodulators 22 and 24. During this process the unwanted quadratic component is suppressed. It is observed that it is necessary for certain embodiments of the demodulation means that the amplitudes of the first and second quadrature signals are the same. However, there are also embodiments for the demodulation means 30 in which the amplitudes of the first and second quadrature signals need not be the same.

Figure 2:
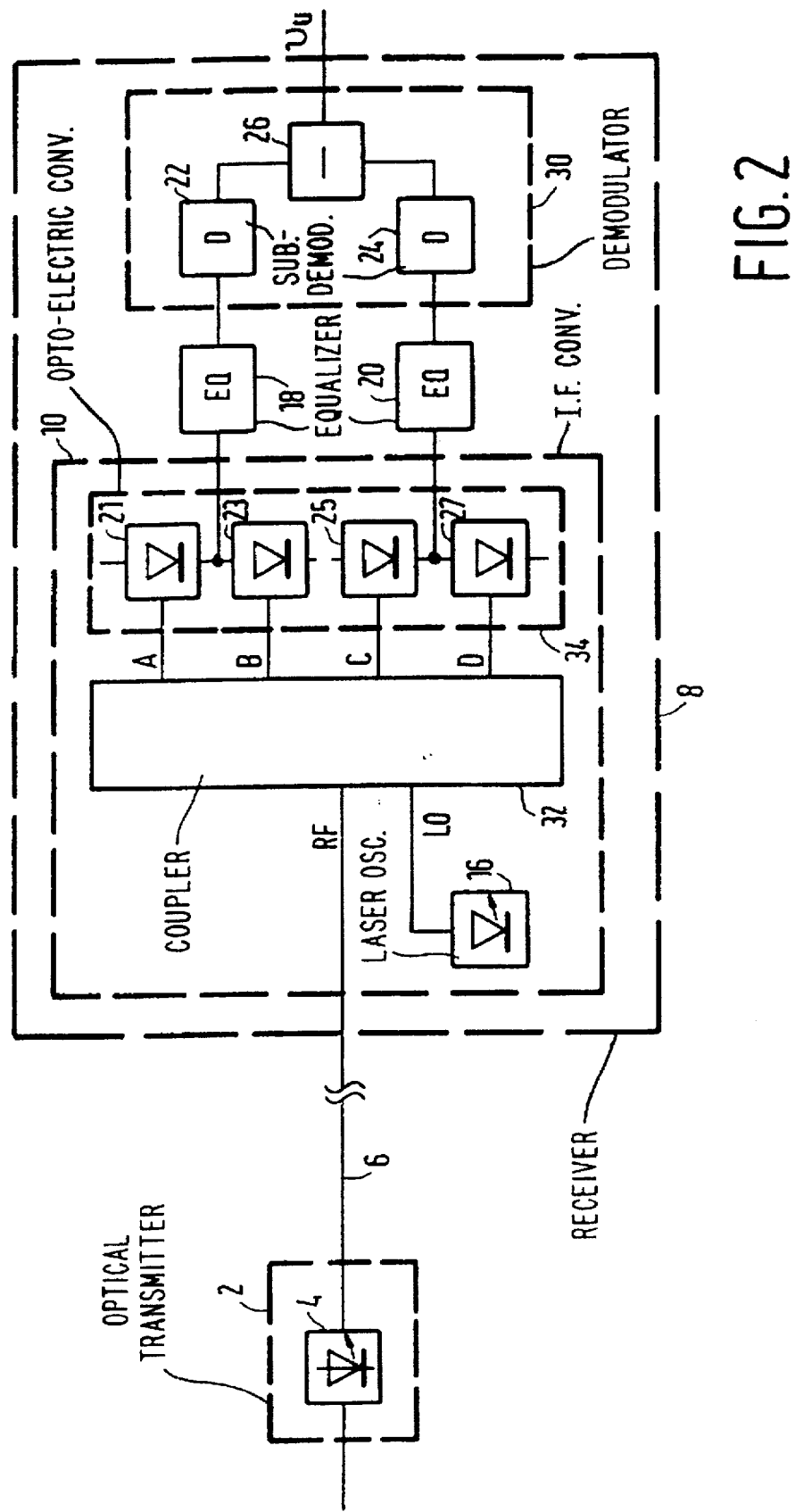
FIG. 2 shows a second embodiment of the invention.

The transmission system shown in FIG. 2 differs from the transmission system shown in FIG. 1 in that a coupling element 32 different from the coupling element 14 of FIG. 1 is used and in that an opto-electrical converter 34 different from the opto-electrical converter 11 of FIG. 1 is used.

The four outputs of the coupling element 32 carry output signals that are mutually shifted by 90°. Each of these optical signals is applied to its own photodiode 21, 23, 25, 27 respectively, while always the difference between two output signals of two photodiodes is taken whose corresponding optical signals are shifted through 90°. The use of four output signals mutually shifted by 90° instead of two signals shifted by 90° is advantageous in that amplitude variations of the optical local oscillator signal cannot be perceived at the output of the opto-electrical converters. In order to obtain this effect, the relationship between the phase of each of the four output signals and the phase of the modulated input signal, respectively, is to correspond to the following Table.

| output | phase difference relative to LO | phase difference relative to RF |
|---|---|---|
| A | $\phi$ | $\theta$ |
| B | $\phi$ | $\theta + \pi$ |
| C | $\phi + \pi/2$ | $\theta + \pi/2$ |
| D | $\phi + \pi/2$ | $\theta - \pi/2$ |

On the two outputs of the opto-electrical converter 34 are then available the first and the second quadrature signal which have the same amplitude. The operation of the demodulation means 30 corresponds to that of FIG. 1 and will be further explained hereafter. It is noted that when frequency demodulation means are used, it is possible to adjust the local laser oscillator frequency by the signal $v_u$, so that the intermediate frequency has a predetermined value.

Figure 3:
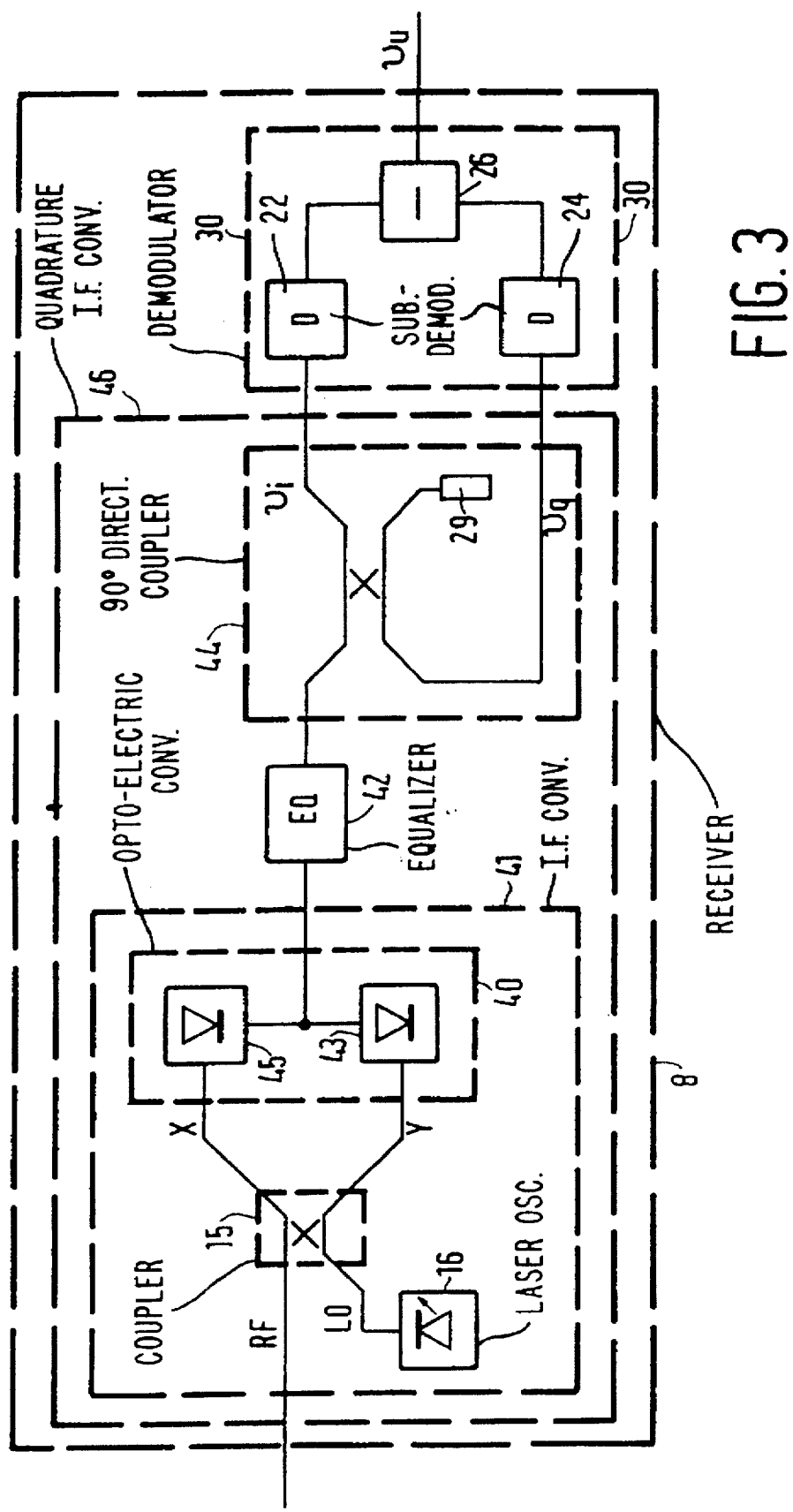
FIG. 3 shows a third embodiment of the invention.

In the receiver 8 shown in FIG. 3 a received modulated signal is applied to an input of IF converter means 41. Inside converter means 41 the modulated signal is applied to a first input of a coupling element 15. The output of a local laser 16 is connected to a second input of the coupling element 15. A first output of the coupling element is connected to a photodiode 45 while a second output of the coupling element 15 is connected to a photodiode 43. The outputs of the photodiodes 45 and 43 are interconnected so that the signals generated by the two diodes 45 and 43 are subtracted from each other. The resulting output of the two photodiodes 45 and 47 is connected to an equalizer 42. The output of the equalizer 42 is connected to an input of the quadrature signal generating means formed here by a 90° directional coupler 44. A first output of the 90° directional coupler 44 is connected to a first input of the demodulation means 30. A second output of the 90° directional coupler 44 is connected to a terminating resistor 29 which has an impedance equal to the characteristic impedance belonging to the 90° directional coupler 44, while a third output of the 90° directional coupler 44 is connected to a second input of the demodulation means 30. The structure of the demodulation means 30 is the same as the demodulation means 30 shown in FIGS. 1 and 2. The combination of IF converter means 41 and directional coupler 44 constitutes a quadrature IF converter 46.

In the receiver 8 shown in FIG. 3 the coupling unit 15 mixes the modulated signal with the local oscillator signal coming from the laser 16. The use of two photodiodes 43 and 45, whose output signals are subtracted from each other, requires that the output signals of the coupling element 15 are converted into an intermediate frequency signal whose amplitude is not affected by amplitude variations of the local oscillator signal. To realise this, it is necessary for the relation between the phase of the two output signals and the phase of the modulated signal or input signal respectively, to correspond to the following Table.

| output | phase difference relative to LO | phase difference relative to RF |
|---|---|---|
| X | $\phi$ | $\theta$ |
| Y | $\phi$ | $\theta - \pi$ |

To compensate for the dispersion of the glass fibre in the transmission system, the equalizer 42 is inserted between the opto-electrical converter and the 90° directional coupler. It is noted that in the receiver shown in FIG. 3 only a single equalizer is necessary, whereas in the receivers 8 shown in FIGS. 1 and 2 two identical equalizers are necessary. For the two output signals $v_i$ and $v_q$ of the 90° directional coupler 44 there may be written:

$$V_i = A \cdot k \cdot \cos[|\omega_c - \omega_{LO}| \cdot t] \tag{1}$$

$$v_q = A \cdot \sqrt{1-k^2} \cdot \sin[|\omega_c - \omega_{LO}| \cdot t] \tag{2}$$

In (1) and (2) k is the coupling factor of the 90° directional coupler, A is an amplitude constant, $\omega_c$ is the angular frequency of the optical signal and $\omega_{LO}$ the angular frequency of the local laser signal.

If k is equal to an $\frac{1}{2}\sqrt{2}$, the amplitudes of the two quadrature signals are the same. If the value of k is different from $\frac{1}{2}\sqrt{2}$, the amplitudes of the two quadrature signals are different. The demodulation means 30 convert the two quadrature signals into a single replica of the input signal transmitted by the transmitter. It is noted that, albeit unmodulated signals are dealt with for simplicity of calculation, it is obvious that these calculations also hold for modulated signals. For example, in the case of frequency modulation, $\omega_c$ depends on the input signal of the transmitter, but this does not affect the validity of (1) or (2) or formulae derived therefrom.

Figure 4:
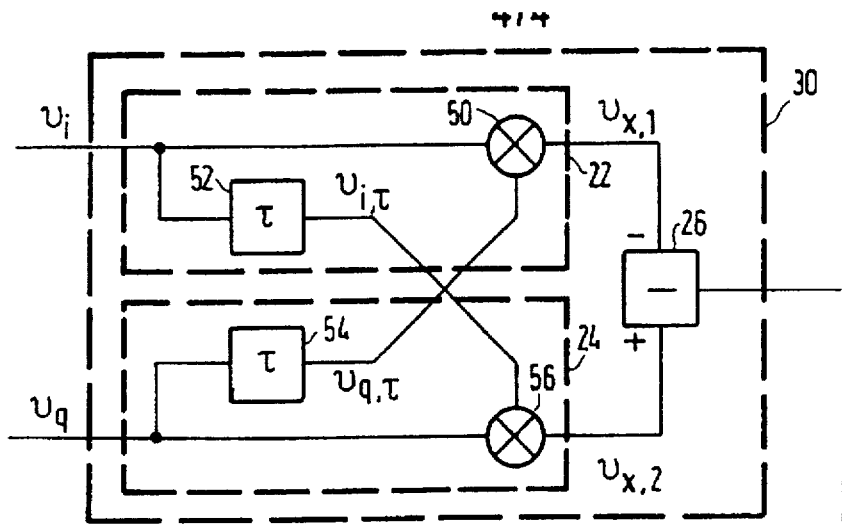
FIG. 4 shows a first embodiment for the frequency demodulation means 30 to be used in the receiver 8 shown in FIG. 1, 2 or 3.

In the frequency demodulation means 30 shown in FIG. 4 the first quadrature signal $v_i$ is applied to a first input of a multiplier 50 and to an input of a delay element 52. The second quadrature signal $v_q$ is applied to a first input of a multiplier 56 and to an input of a delay element 54. The output of the delay element 54 is connected to a second input of the multiplier circuit 50, while the output of the delay element 52 is connected to a second input of the multiplier 56.

The output of the multiplier 50 is connected to a first input of a subtracter circuit 26. The output of the multiplier 56 is connected to a second input of the subtracter circuit 26. The combination of the multiplier 50 and the delay element 52 forms the first sub-demodulator. The combination of the multiplier 56 and the delay element 54 forms the second sub-demodulator.

If assuming that the signals $v_i$ and $v_q$ are equal to (1) or (2) respectively, the following holds for the output signal $v_{i,\tau}$ of the delay element 52:

$$v_{i,\tau} = A \cdot k \cdot \cos[|\omega_c - \omega_{LO}| \cdot (t-\tau)] \tag{3}$$

For the output signal $v_{q,\tau}$ of the delay element 54 then holds:

$$v_{q,\tau} = A \cdot \sqrt{1-k^2} \cdot \sin[|\omega_c - \omega_{LO}| \cdot (t-\tau)] \tag{4}$$

For the output signal $v_{x,1}$ of the multiplier 50 is then found:

$$v_{x,1} = \frac{A^2 \cdot k \cdot \sqrt{1-k^2}}{2} \{\sin[(2\omega_c - \omega_{LO}| \cdot t - |\omega_c - \omega_{LO}| \cdot \tau] - \sin[|\omega_c - \omega_{LO}| \cdot \tau]\} \tag{5}$$

The output signal $v_{x,2}$ of the multiplier 56 is then equal to:

$$v_{q,1} = \frac{A^2 \cdot k \cdot \sqrt{1-k^2}}{2} \{\sin[(2\omega_c - \omega_{LO}| \cdot t - |\omega_c - \omega_{LO}| \cdot \tau] + \sin[|\omega_c - \omega_{LO}| \cdot \tau]\} \tag{6}$$

For the output signal of the subtracter circuit 26 is then found:

$$v_u = A^2 \cdot k \sqrt{1-k^2} \cdot \sin[|\omega_c - \omega_{LO}| \cdot t] \tag{7}$$

From (7) it appears that the unwanted quadratic component in the output signals $v_{x,1}$ and $v_{x,2}$ is no longer present in the output signal $v_u$. By elimination of the unwanted quadratic term it is possible to reduce the intermediate frequency considerably compared with the state-of-the-art transmission system. In addition, it turns out that it is not necessary here that the amplitudes of the two quadrature signals be the same.

If the (electrical) quadrature signal generating means are not used, but instead an optical coupling element generating optical quadrature signals is used, the following holds for the signals $v_i$ and $v_q$:

$$v_i = A \cdot k \cdot \cos[(\omega_c - \omega_{LO}) \cdot t] \tag{8}$$

$$v_q = A \cdot \sqrt{1-k^2} \cdot \sin[(\omega_c - \omega_{LO}) \cdot t] \tag{9}$$

For the output signal $v_u$ of the demodulation means 30 then holds:

$$v_u = A^2 \cdot k \sqrt{1-k^2} \cdot \sin[(\omega_c - \omega_{LO}) \cdot t] \tag{10}$$

The difference between (10) and (7) is that in (10) the sign of the difference between the frequency of the modulated signal and the frequency of the local oscillator signal is expressed in the sign of the output signal of the demodulation means 30.

Figure 5:
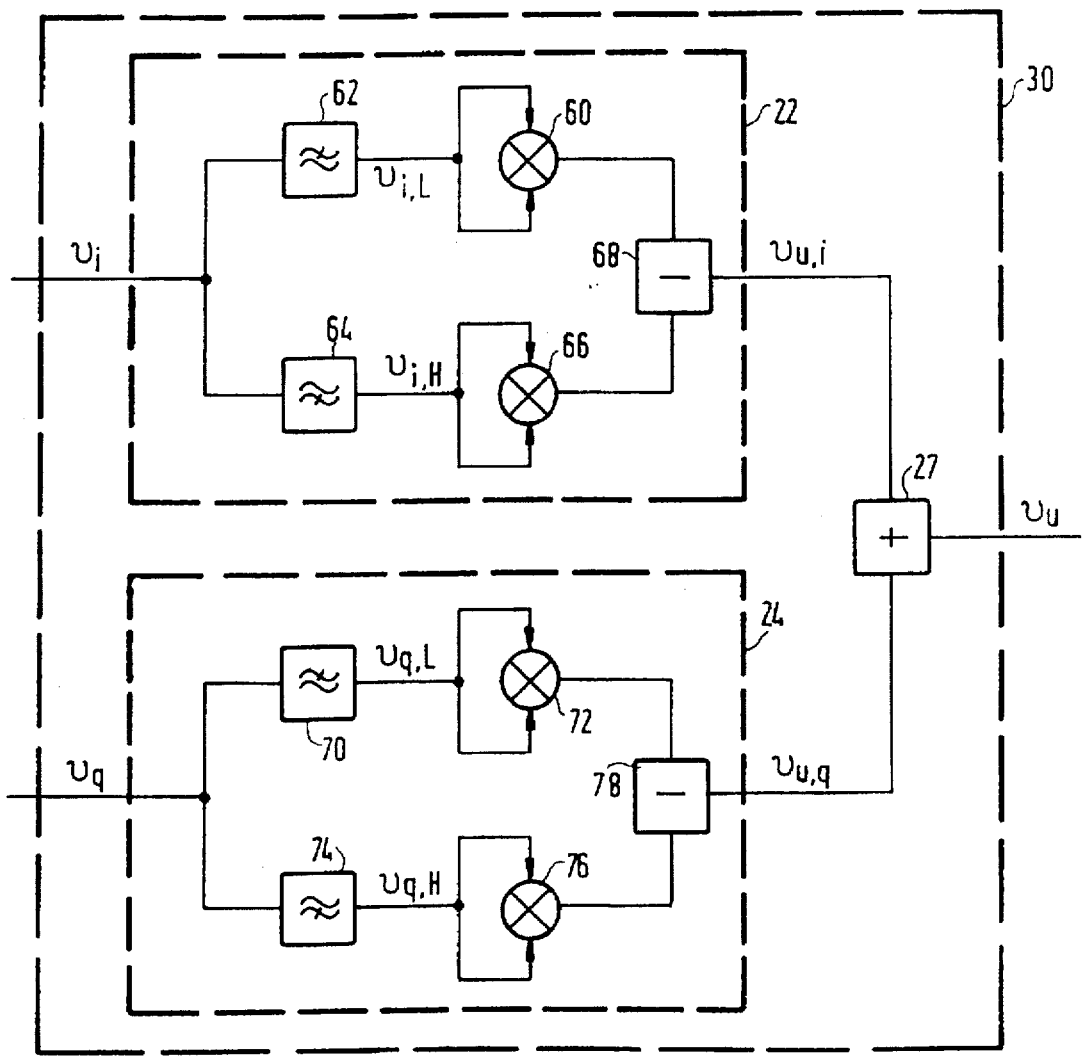
FIG. 5 shows a second embodiment for the frequency demodulation means 30 to be used in the receiver 8 shown in FIG. 1, 2 or 3.

In the demodulation means 30 shown in FIG. 5 the signal $v_i$ [$v_q$] is applied to a low-pass filter 62 [70] and to a high-pass filter 64 [74]. The output of the low-pass filter 62 [70] is connected to two inputs of a multiplier 60 [72]. The output of the high-pass filter 64 is connected to two inputs of a multiplier 66 [76]. The output of the multiplier 60 [72] is connected to a first input of a subtracter circuit 68 [78], while the output of the multiplier 66 [76] is connected to a second input of the subtracter circuit 68 [78]. The output of the subtracter circuit 68 is connected to a first input of the combining means, in this case formed by an adder circuit 27. The output of the subtracter circuit 78 is connected to a second input of the adder circuit 27.

The low-pass filter 62, the high-pass filter 64, the multipliers 60 and 66 and the subtracter circuit 68 together form the first sub-demodulator. The low-pass filter 70, the high-pass filter 74, the multipliers 72 and 76 and the subtracter circuit 78 together form the second sub-demodulator.

For the demodulation means shown in FIG. 5 it is assumed that the input signals $v_i$ and $v_q$ have the same amplitude. If, additionally, first-order filters are assumed to have the same cut-off frequency, there may be written for the signals $v_{i,L}$ and $v_{i,H}$:

$$v_{i,L} = \frac{A'}{\sqrt{1+\left(\frac{\omega_c - \omega_{LO}}{\omega_0}\right)^2}} \cdot \cos[|\omega_c - \omega_{LO}| \cdot t - \phi_L] \tag{11}$$

$$v_{i,H} = A' \frac{|\omega_c - \omega_{LO}|}{\omega_0 \sqrt{1+\left(\frac{\omega_c - \omega_{LO}}{\omega_0}\right)^2}} \cdot \cos[|\omega_c - \omega_{LO}| \cdot t + \phi_H] \tag{12}$$

In (11) and (12) $\omega_0$ is the angular frequency that corresponds to the cut-off frequency of the filters 62 and 64. $\phi_L$ in (11) is equal to:

$$\phi_L = \arctan\left(\frac{|\omega_c - \omega_{LO}|}{\omega_0}\right) \tag{13}$$

$\phi_H$ in (12) is equal to:

$$\phi_H = \arctan\left(\frac{\omega_0}{|\omega_c - \omega_{LO}|}\right) \tag{14}$$

By squaring the signals according to (11) and (12) by the multipliers 60 and 66, and subtracting these squared signals by the subtracter circuit 68, output signal $v_{u,i}$ of the first sub-demodulator 22 will then be found to be:

$$v_{u,i} = \frac{A^2}{1+\left(\frac{\omega_c - \omega_{LO}}{\omega_0}\right)^2} \cdot \tag{15}$$

$$\left\{ \cos^2[|\omega_c - \omega_{LO}| \cdot t - \phi_L] - \frac{(\omega_c - \omega_{LO})^2}{\omega_0^2} \cdot \cos^2[|\omega_c - \omega_{LO}| \cdot t + \phi_H] \right\}$$

Similarly, there may be found for the output signal $v_{u,q}$ of the sub-demodulator 24:

$$v_{u,q} = \frac{A^2}{1+\left(\frac{\omega_c - \omega_{LO}}{\omega_0}\right)^2} \cdot \tag{16}$$

$$\left\{ \sin^2[|\omega_c - \omega_{LO}| \cdot t - \phi_L] - \frac{(\omega_c - \omega_{LO})^2}{\omega_0^2} \cdot \sin^2[|\omega_c - \omega_{LO}| \cdot t + \phi_H] \right\}$$

For the output signal $v_u$ of the demodulation means 30 it then holds:

$$v_u = \frac{A^2 \cdot [\omega_0^2 - (\omega_c - \omega_{LO})^2]}{\omega_0^2 + (\omega_c - \omega_{LO})^2} \tag{17}$$

Here too there can be noticed that the output signal contains only a component that depends on the current intermediate frequency, without quadratic terms being present. If optical quadrature signal generating means are used, the absolute values in (15) and (16) are dropped, but this does not further affect the result according to (17).

It is noted that not only a first-order low-pass and high-pass filter but also higher-order filters can be used. Additionally, it is possible to use transmission line filters as is shown in the above cited U.S. Patent.

We claim:

1. An optical heterodyne receiver for receiving and demodulating a transmitted optical signal having an optical carrier wave which is modulated by an information signal, comprising:

IF converter means for converting the received modulated optical signal into first and second electrical intermediate frequency (IF) modulated signals which are in quadrature; and demodulating means which comprises a first sub-demodulator for deriving a first demodulated signal from the first IF modulated signal;

a second sub-demodulator for deriving a second demodulated signal from the second IF modulated signal;

each of said sub-demodulators having a quadratic amplitude transfer characteristic such that there is also produced from the relevant IF modulated signal a quadratic signal component of higher frequency, the two higher frequency signal components produced from the two IF modulated signals being substantially in phase opposition; and combining means for (i) combining the first and second demodulated signals to recover a replica of said information signal, and (ii) combining the two phase opposed higher frequency signal components to thereby provide substantial mutual cancellation thereof.

2. A receiver as claimed in claim 1, wherein the first sub-demodulator comprises means for delaying the first IF signal and a first multiplier for multiplying the first IF signal by a delayed second IF signal, and the second sub-demodulator comprises means for delaying the second IF signal and a second multiplier for multiplying the second IF signal by a delayed first IF signal.

3. A receiver as claimed in claim 1, wherein:

the first sub-demodulator comprises low pass and high pass filter means for respectively deriving first and second filtered signals from the first IF signal, first and second squaring means for respectively squaring the first and second filtered signals, and combining means for combining the squared first and second filtered signals to derive said first demodulated signal; and the second sub-demodulator comprises further low pass and high pass filter means for respectively deriving third and fourth filtered signals from the second IF signal, third and fourth squaring means for respectively squaring the third and fourth filtered signals, and combining means for combining the squared third and fourth filtered signals to derive said second demodulated signal.

* * * * *